(12) United States Patent
Drake et al.

(10) Patent No.: US 10,405,452 B2
(45) Date of Patent: Sep. 3, 2019

(54) RACK COVER ASSEMBLY AND SYSTEM

(71) Applicant: Level 3 Communications, LLC, Broomfield, CO (US)

(72) Inventors: Steven E. Drake, Thornton, CO (US); Eric R. Peake, Loveland, CO (US)

(73) Assignee: Level 3 Communications, LLC, Broomfield, CO (US)

( * ) Notice: Subject to any disclaimer, the term of this patent is extended or adjusted under 35 U.S.C. 154(b) by 0 days.

(21) Appl. No.: 16/272,471

(22) Filed: Feb. 11, 2019

(65) Prior Publication Data

US 2019/0174652 A1 Jun. 6, 2019

Related U.S. Application Data

(63) Continuation of application No. 15/791,682, filed on Oct. 24, 2017, now Pat. No. 10,206,306.

(60) Provisional application No. 62/419,855, filed on Nov. 9, 2016.

(51) Int. Cl.
*H05K 7/18* (2006.01)
*H05K 7/14* (2006.01)
*A47B 96/20* (2006.01)
*H05K 7/20* (2006.01)

(52) U.S. Cl.
CPC .............. *H05K 7/18* (2013.01); *A47B 96/20* (2013.01); *H05K 7/1488* (2013.01); *H05K 7/20736* (2013.01); *H05K 7/20536* (2013.01)

(58) Field of Classification Search
CPC .... H05K 7/18; H05K 7/1488; H05K 7/20536; H05K 7/183; H05K 7/1425; H05K 7/14; H05K 5/02; H05K 5/0243; H05K 5/03; H05K 5/0239; H05K 7/20736; A47B 96/20; G06F 1/181; G06F 1/16
USPC ...... 211/6, 183; 312/223.2; 361/679.02, 724; 174/66, 67
See application file for complete search history.

(56) References Cited

U.S. PATENT DOCUMENTS

| | | |
|---|---|---|
| 4,914,874 A | 4/1990 | Graham |
| 5,199,776 A | 4/1993 | Lin |
| 5,542,757 A | 8/1996 | Chang |
| 5,654,874 A | 8/1997 | Suzuki |
| 5,783,777 A | 7/1998 | Kruse |
| RE36,695 E | 5/2000 | Holt |
| 6,102,501 A | 8/2000 | Chen |
| 6,278,606 B1 | 8/2001 | Schmitt |
| 6,281,433 B1 | 8/2001 | Decker |
| 6,367,897 B1 | 4/2002 | Bass |
| 6,547,348 B2 | 4/2003 | Craft |
| 6,597,576 B1 | 7/2003 | Smith |

(Continued)

*Primary Examiner* — Jennifer E. Novosad

(57) ABSTRACT

A rack cover assembly including a first side cover and a second side cover. The first side cover may include a first tensioner and a first flexible rectangular sheet. The first tensioner may be coupled to the first flexible rectangular sheet at or near a first lateral edge. The first tensioner may include a first tensioner height that is less than a first sheet height between the first top edge and the first bottom edge. The second cover may include a second tensioner and a second flexible rectangular sheet configured to couple with the first flexible rectangular sheet. The second tensioner may be coupled to the second flexible rectangular sheet at or near a second lateral edge. The second tensioner may include a second tensioner height that is less than a second sheet height between the second top edge and the second bottom edge.

20 Claims, 5 Drawing Sheets

(56) References Cited

U.S. PATENT DOCUMENTS

| | | |
|---|---|---|
| 6,601,932 B1 | 8/2003 | Helgenberg |
| 6,711,008 B2 | 3/2004 | Ten |
| 6,758,353 B2 | 7/2004 | Orr |
| 6,826,057 B1 | 11/2004 | Gundogan |
| 7,506,768 B2 | 3/2009 | Rassmussen |
| 7,782,625 B2 | 8/2010 | Taylor |
| 8,077,452 B2 | 12/2011 | Wang |
| 8,113,599 B2 | 2/2012 | Klassen |
| 8,251,321 B2 | 8/2012 | Chen |
| 8,262,041 B2 | 9/2012 | Bergesch |
| 8,327,598 B2 | 12/2012 | Shew |
| 8,678,524 B2 | 3/2014 | Green |
| 8,982,565 B2 | 3/2015 | Sherrod |
| 9,072,193 B1 | 6/2015 | Eichelberg |
| 9,155,219 B2 | 10/2015 | Watanabe |
| 9,155,220 B2 | 10/2015 | Yokosawa |
| 9,615,488 B1 | 4/2017 | Eichelberg |
| 9,723,747 B1 | 8/2017 | Marrs |
| 9,775,260 B1 | 9/2017 | Warlick |
| 10,206,306 B2 * | 2/2019 | Drake ................ H05K 7/20736 |
| 2001/0046123 A1 | 11/2001 | Wedding |
| 2004/0232098 A1 | 11/2004 | Orr |
| 2008/0164789 A1 | 7/2008 | Williams |
| 2008/0310126 A1 | 12/2008 | Lakoduk |
| 2011/0186532 A1 | 8/2011 | Wu |
| 2018/0132375 A1 | 5/2018 | Drake et al. |

\* cited by examiner

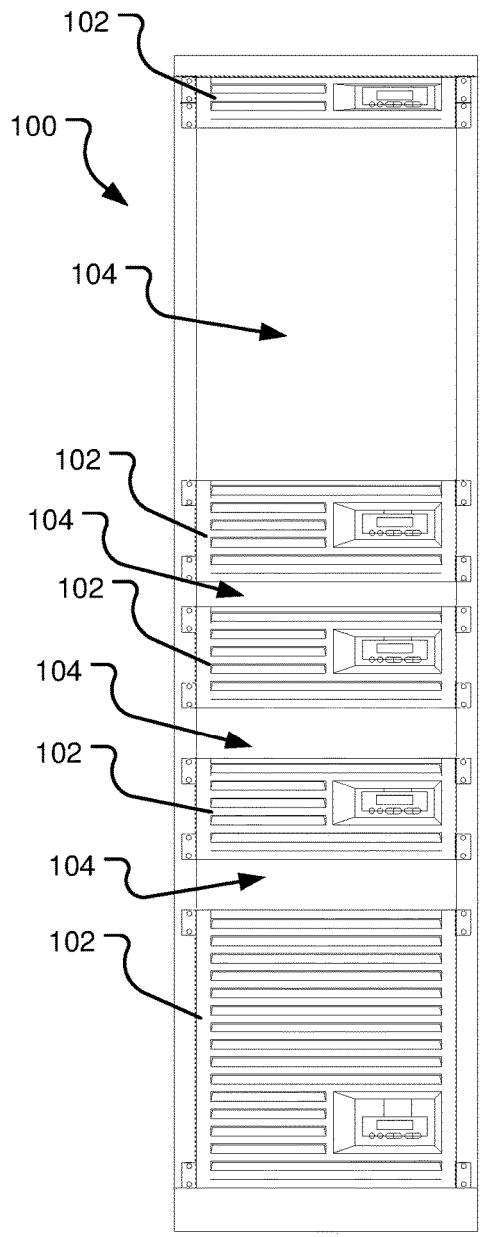
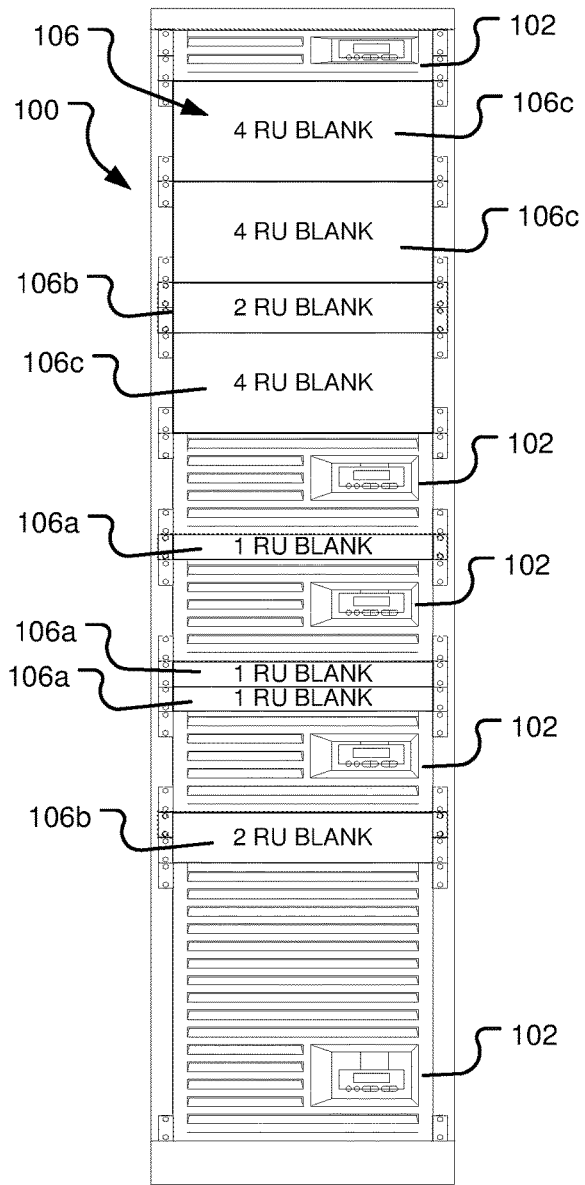
FIG. 1A
(PRIOR ART)
FIG. 1B
(PRIOR ART)

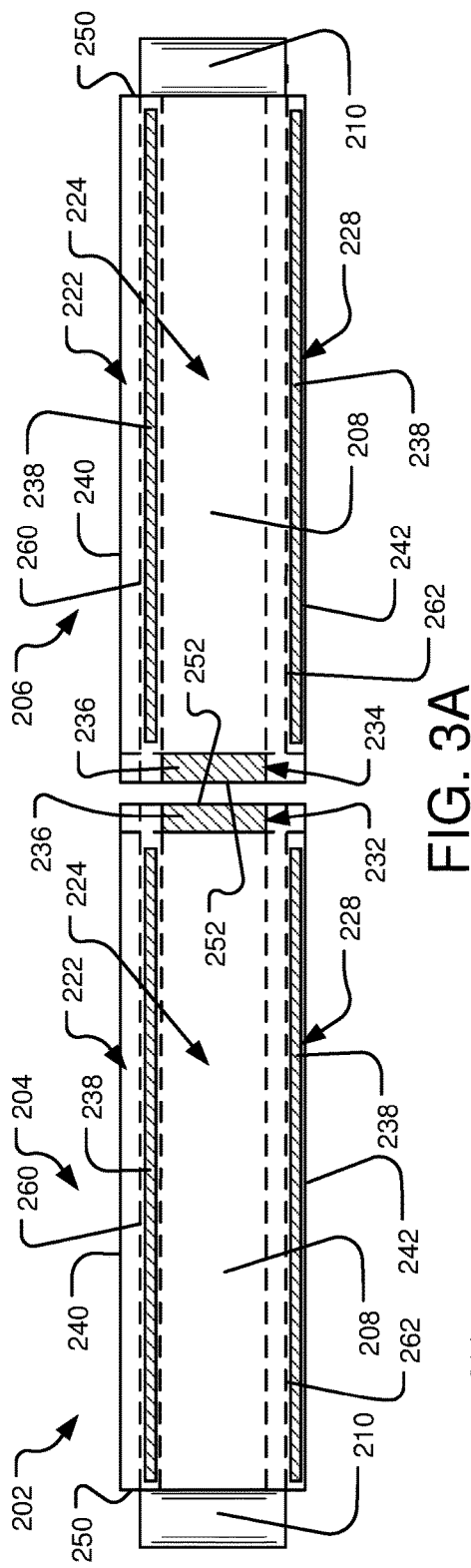
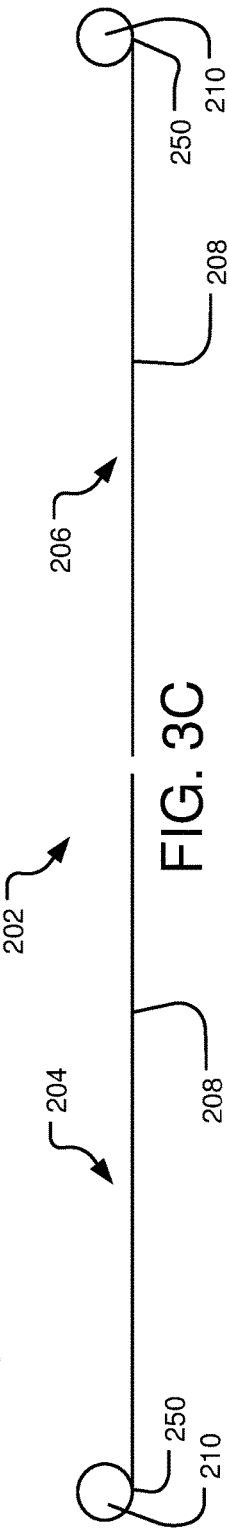
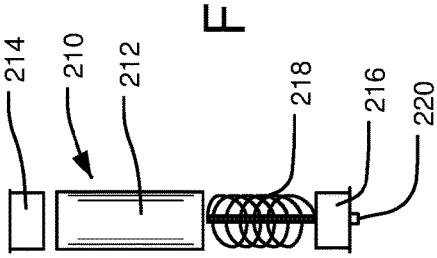
FIG. 3A
FIG. 3B
FIG. 3C

RACK COVER ASSEMBLY AND SYSTEM

CROSS-REFERENCE TO RELATED APPLICATIONS

The present application is a continuation of and claims the benefit of priority from U.S. patent application Ser. No. 15/791,682, filed Oct. 24, 2017, entitled "RACK COVER ASSEMBLY AND SYSTEM", the entire contents of which are fully incorporated by reference herein for all purposes. Application Ser. No. 15/791,682 claims priority under 35 U.S.C. § 119 from U.S. Provisional Patent Application No. 62/419,855, filed Nov. 9, 2016, entitled "RACK COVER ASSEMBLY AND SYSTEM", the entire contents of which are fully incorporated by reference herein for all purposes.

TECHNICAL FIELD

Aspects of the present disclosure involve a rack cover assembly and system for blocking airflow through empty slots in a rack (e.g., server racks, equipment racks, cabinets, storage libraries) in data centers and gateway facilities.

INTRODUCTION

Data centers and gateway facilities consume massive amounts of energy, not only from the various computer, telecommunications, and storage systems in the facilities, but also from the respective cooling systems needed to manage the heat generated by the equipment. With continuing expansion of computing networks, rising energy costs, and a desire to operate sustainable facilities, the need to efficiently manage energy consumption in data centers and gateway facilities becomes increasingly important. While facility operators may have somewhat limited control over the energy consumed by each piece of equipment in the data center or gateway facility, operators can control the flow of hot and cold air around the equipment.

A data center is a computing hub that contains servers and storage equipment that run application software that processes and stores content and data. A gateway facility, on the other hand, is a telecommunications hub, or node, that processes and routes various forms of communication (e.g., phone calls, web browsing, streaming video) through a vast network of interconnected nodes, networks, and users. While data centers and gateway facilities may perform different functions, both facilities use similar, and often the same, equipment (e.g., servers, routers, switches, server appliances, storage libraries) and face the same thermal management challenges.

In order to keep the equipment running optimally, the layout of data centers and gateway facilities are designed in conjunction with the heating, ventilation, and air-conditioning (HVAC) systems or, more particular to this type of environment, the computer room air-conditioning (CRAC) system. Because most server and gateway type equipment are mounted on standardized racks, and the equipment is designed to intake cool air in the front of the unit and exhaust hot air in the back of the unit, the CRAC system is designed to flow cool air to the front of the equipment racks and to pull hot air from back of the racks for recirculation into the CRAC system.

Thermal management becomes challenging when airflow is permitted to freely flow from the hot side or back of the units in the rack to the cool side or front of the units in the rack. Because equipment in the racks require maintenance, replacement, and/or reconfiguration, there are times when the racks are only partially filled, leaving gaps for air to flow from the back of the racks to the front. Additionally, racks may be only partially filled when scaling an operation up or down. As seen in FIG. 1A, which is a front view of a rack 100 housing five devices or pieces of equipment 102 (e.g., server, router), the rack 100 is only partially full. This partially full rack 100 permits hot air to flow from the back of the rack 100 to the front of the rack 100 through various slots or openings 104 between the devices 102 such that the hot air comingles with the cool air meant to cool the devices 102.

As seen in FIG. 1B, which is a front view of the same rack 100 and equipment 102 of FIG. 1, blanks or blanking panels 106 of different sizes are used to cover the open space or slots between the devices 102 such that the airflow is blocked from passing through the rack 100 and between the equipment 102. The blanks 106 come in various sizes to accommodate different sized slots or openings in the rack 100. Standardized racks (e.g., 19 inch, 23 inch), as well as the equipment 102 in the racks 100, are measured in height by rack units, abbreviated as RU or U. Each RU is defined as 1.75 inches (44.45 mm). For example, a piece of equipment may be 1 RU, 2 RU, 4 RU, or 11 RU, among others. Similarly, the blanks 106 may be sized in 1 RU, 2 RU, or 4 RU, among others. As seen in FIG. 1B, blank 106a is 1 RU in height, blank 106b is 2 RU in height, and blank 106c is 4 RU in height. Typically, the blanks 106 are steel panels with mounting holes provided that match corresponding mounting holes in the rack 100.

While blanks 106 may aid operators in thermally managing a data center or gateway facility, there are disadvantages such as the need to accumulate and store many blanks 106 of varying sizes to accommodate a multitude of configurations of partially filled racks. Additionally, the operator may need to transport the blanks 106 from a storage facility (e.g., within or remote from the data center or gateway facility) to the rack 100, which may cause the hot and cold air to comingle for a long period of time before the operator can install the appropriate blanks 106.

With these thoughts in mind among others, aspects of the rack blanking apparatus and system disclosed herein were conceived.

SUMMARY

Aspects of the present disclosure may involve a rack cover assembly including a first side cover and a second side cover. The first side cover may include a first tensioner and a first flexible rectangular sheet including a first lateral edge, a first medial edge opposite the first lateral edge, a first top edge, and a first bottom edge opposite the first top edge and adjacent the first lateral edge and the first medial edge. The first medial edge may include a first fastener, the first tensioner coupled to the first flexible rectangular sheet at or near the first lateral edge, the first tensioner including a first tensioner height that is less than a first sheet height between the first top edge and the first bottom edge. The second side cover may include a second tensioner and a second flexible rectangular sheet including a second lateral edge, a second medial edge opposite the second lateral edge, a second top edge, and a second bottom edge opposite the second top edge and adjacent the second lateral edge and the second medial edge. The second medial edge may include a second fastener configured to couple with the first fastener, the second tensioner coupled to the second flexible rectangular sheet at or near the second lateral edge, the second tensioner including a second tensioner height that is less than a second sheet height between the second top edge and the second bottom edge. The first side cover and the second side cover may be configured to be used in conjunction with one another to cover a slot in a rack.

In certain instances, the first top edge is foldable along a first top fold line extending a first length of the first flexible rectangular sheet, the first bottom edge is foldable along a first bottom fold line extending the first length, a first distance between the first top fold line and the first bottom fold line being substantially equal to the first tensioner height, and wherein the second top edge is foldable along a second top fold line extending a second length of the second flexible rectangular sheet, the second bottom edge is foldable along a second bottom fold line extending the second length, a second distance between the second top fold line and the second bottom fold line being substantially equal to the second tensioner height.

In certain instances, the first flexible rectangular sheet may further include a first top fastener and a first bottom fastener, the first top fastener positioned above the first top fold line, the first bottom fastener positioned above the first bottom fold line, and wherein the second flexible rectangular sheet may further include a second top fastener and a second bottom fastener, the second top fastener positioned above the second top fold line, the second bottom fastener positioned above the second bottom fold line.

In certain instances, the first flexible rectangular sheet may further include a first top fastener and a first bottom fastener, the first top fastener positioned below the first top fold line, the first bottom fastener positioned below the first bottom fold line, and wherein the second flexible rectangular sheet may further include a second top fastener and a second bottom fastener, the second top fastener positioned below the second top fold line, the second bottom fastener positioned below the second bottom fold line.

In certain instances, the first tensioner may be configured to be coupled to a first vertical mounting post of the rack, and the second tensioner may be configured to be coupled to a second vertical mounting post of the rack that is opposite the first vertical mounting post, the first flexible rectangular sheet may be configured to unfurl from first tensioner and the second flexible rectangular sheet may be configured to unfurl from the second tensioner such that the first and second fasteners are fastened together at about a midpoint between the first and second vertical mounting posts of the rack.

In certain instances, when the first and second fasteners are fastened together, the first and second side covers may combine to cover a slot in the rack.

In certain instances, the slot may be 1 RU in height.

In certain instances, the first tensioner may include a first spool, the second tensioner may include a second spool, and wherein, in a furled state, the first flexible rectangular sheet is configured to furl on the first spool of the first tensioner, and the second flexible rectangular sheet is configured to furl on a second spool of the second tensioner, the first and second flexible rectangular sheets do not cover the slot in the rack in the furled state.

In certain instances, the first tensioner height may be equal to the second tensioner height, and the first sheet height may be equal to the second sheet height.

In certain instances, the first sheet height and the second sheet height may be at least 1.75 inches.

In certain instances, the first sheet height and the second sheet height may be about 2.0 inches.

In certain instances, the first fastener and the second fastener may include a complementary hook and loop closure system.

In certain instances, the rack cover assembly may further include at least one of a tensioner bracket or a shaft for coupling the first and second side covers to a rack.

Aspects of the present disclosure may involve a kit including at least one rack cover assembly, and may further include packaging materials to package the at least one of the rack cover assembly.

In certain instances, the kit may further include at least one tensioner bracket for coupling the rack cover assembly to a rack.

In certain instances, the kit may further include at least one shaft for vertically orienting the at least one of the rack cover assembly relative to a rack.

Aspects of the present disclosure may involve a system for blocking slots in a rack including an upper cover assembly and a lower cover assembly. The upper cover assembly for covering an upper slot in the rack and including a first upper side cover and a second upper side cover. The first upper side cover coupling to a first portion of the rack. The second upper side cover coupling to a second portion of the rack. The first upper side cover including a first upper side flexible rectangular sheet configured to extend and retract from the first portion of the rack. The second upper side cover including a second upper side flexible rectangular sheet configured to extend and retract from the second portion of the rack. The first upper side flexible rectangular sheet and the second upper side flexible rectangular sheet configured to couple to each other when in a first extended state so as to cover the upper slot. The lower cover assembly for covering a lower slot in the rack. The lower slot being immediately below the upper slot. The lower cover assembly including a first lower side cover and a second lower side cover. The first lower side cover coupling to the first portion of the rack. The second lower side cover coupling to the second portion of the rack. The first lower side cover including a first lower side flexible rectangular sheet configured to extend and retract from the first portion of the rack. The second lower side cover including a second lower side flexible rectangular sheet configured to extend and retract from the second portion of the rack. The first lower side flexible rectangular sheet and the second lower side flexible rectangular sheet configured to couple to each other when in a second extended state so as to cover the lower slot.

In certain instances, a top edge of the lower cover assembly overlays or underlays a bottom edge of the upper cover assembly.

In certain instances, the first upper side cover further includes a first upper tensioner for exerting a retraction force on the first upper side flexible rectangular sheet, the second upper side cover further includes a second upper tensioner for exerting a retraction force on the second upper side flexible rectangular sheet, the first lower side cover further includes a first lower tensioner for exerting a retraction force on the first lower side flexible rectangular sheet, and the second lower side cover further includes a second lower tensioner for exerting a retraction force on the second lower side flexible rectangular sheet.

In certain instances, the system may further include a first side shaft affixed relative to the first portion of the rack and a second side shaft affixed relative to the second portion of the rack, the first upper tensioner and the first lower tensioner being vertically arranged or stacked on the first side shaft, the second upper tensioner and the second lower tensioner being vertically arranged or stacked on the second side shaft.

BRIEF DESCRIPTION OF THE DRAWINGS

Example embodiments are illustrated in referenced figures of the drawings. It is intended that the embodiments and figures disclosed herein are to be considered illustrative rather than limiting.

FIG. 1A (prior art) is a front view of a rack housing five pieces of equipment;

FIG. 1B (prior art) is a front view of a rack housing five pieces of equipment with blanks positioned within the vacant slots between the pieces of equipment;

FIG. 3A is a front view of a cover assembly including a first side cover assembly and a second side cover assembly;

FIG. 3B is a front exploded view of a tensioner;

FIG. 3C is a top view of the first side cover assembly and the second side cover assembly;

DETAILED DESCRIPTION

Figures 2A, 2B:
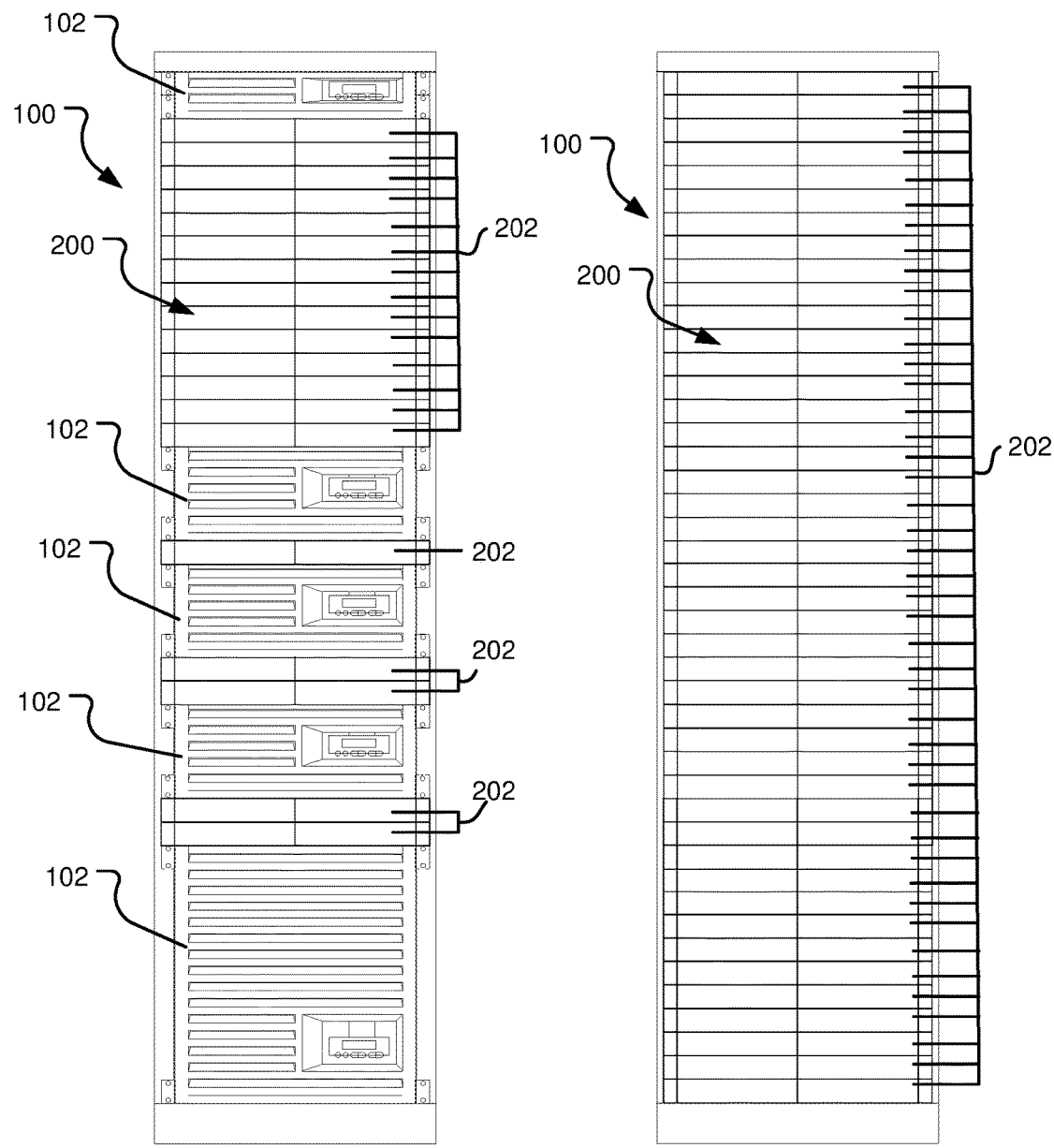
FIG. 2A is a front view of a rack housing five pieces of equipment with cover assemblies covering the vacant slots between the pieces of equipment.
FIG. 2B is a front view of an empty rack with cover assemblies covering all slots in the rack.

Aspects of the present disclosure involve a rack covering apparatus and system for blocking airflow from flowing through open slots in a rack and causing cool and hot air to comingle, which ultimately cause hotter air to flow into the intake of the equipment housed within the rack. As seen in FIG. 2A, which is a front view of a 44 RU rack 100 housing five pieces of equipment 102, the rack covering system 200 includes multiple cover assemblies 202 that are 1 RU in height. Each cover assembly 202 is positioned laterally adjacent a slot in the rack and may be deployed to cover an open slot or retracted so as to not cover the slot. Accordingly, individual cover assemblies 202 may be employed during swapping or reconfiguring of the equipment 102 within the rack 100 on an as-needed basis. For example, if a 2 RU piece of equipment 102 is removed from the rack 100, two cover assemblies 202 may be employed to cover the vacant space or slot that was previously occupied by the 2 RU piece of equipment. Since the cover assemblies 202 are 1 RU in height, as few as 1 RU may be covered with the cover assembly 202, or, for example and as seen in FIG. 2B, all slots in the rack 100 (e.g., 44 RU) may be fully covered with cover assemblies 202. Accordingly, any number of cover assemblies 202 may be employed to fit the given needs of a particular rack 100 of equipment 102.

Reference is made to FIG. 3A, which depicts a front view of a single cover assembly 202. As seen in the figure, the cover assembly 202 includes a left or first side cover assembly 204 and a right or second side cover assembly 206, which is a mirror image design of the first side cover assembly 204. The first and second side cover assemblies 204, 206 are each fitted, respectively, to right and left vertical mounting posts of a rack. When a slot is vacant or open (i.e., no equipment within the slot), the right and left side cover assemblies 204, 206 may be operably couple together at generally a midpoint between right and left vertical mounting posts of the rack to close off or block the formerly open slot. The first and second side cover assemblies 204, 206 include substantially the same components; therefore, they will be discussed together.

The first and second side cover assemblies 204, 206 include a flexible, rectangular sheet 208 and a tensioner 210. The tensioner 210 is coupled to a lateral edge 250 of the rectangular sheet 208. A medial edge 252 of the rectangular sheet 208 is opposite the lateral edge 250. The rectangular sheet 208 also includes a top edge 240 and a bottom edge 242.

Figure 4:
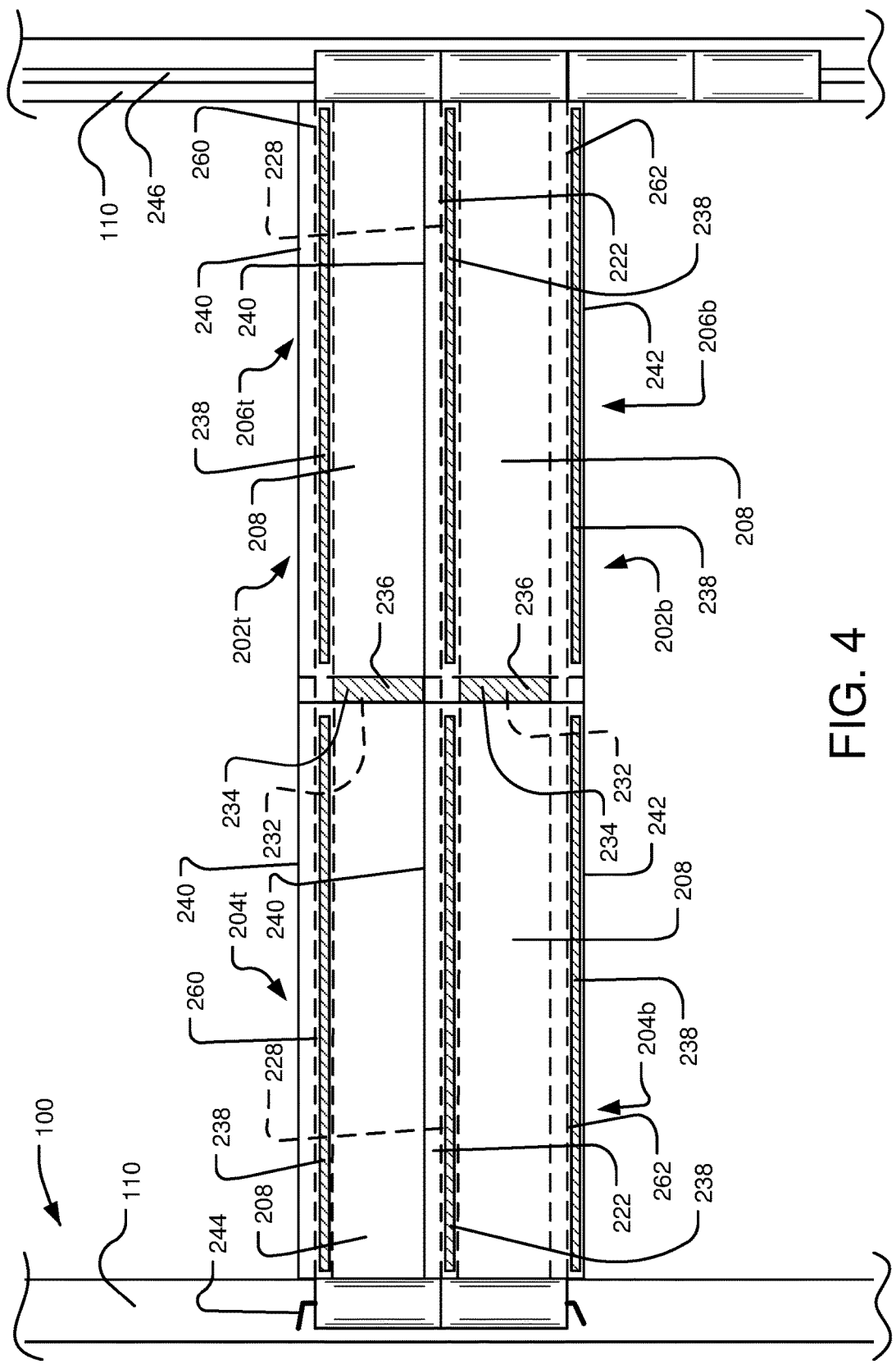
FIG. 4 is a front view of two cover assemblies attached to the vertical mounting posts of a rack.

The tensioner 210 is coupled to the rack 100 at, for example, the vertical mounting post 110, as seen in FIG. 4, which is also the part of the rack 100 that the equipment couples with via a rackmount rail. Returning to FIG. 3B, which is a front exploded view of the tensioner 210, the tensioner 210 may function similar to a roller spring shade and may include a cylindrical housing or spool 212 with a passageway extending longitudinally therethrough, an end or idler plug 214 that fits within the passageway, a spring end plug 216 opposite the end plug 214, and a spring 218 coupled with the spring end plug 216. The spring 218 and the spring end plug 216 may be fitted within the passageway of the spool 212 on a side opposite the end plug 214. The spring 218 may be a torsion spring and may be wound relative to the spring end plug 216 via a shaft 220 to provide a winding or rotational force that tensions the rectangular sheet 208 when it is extended or rolled out. In this way, the rectangular sheet 208, which is flexible, may be coiled on the spool 212 when not needed (i.e., when a piece of equipment is positioned within a slot of the rack), and the rectangular sheet 208 may be pulled outward from the spool 212 towards the middle of the rack 100 (i.e., between the vertical mounting posts 110). And when the rectangular sheet 208 is pulled outward from the spool 212, the tensioner 210 will exert a force towards the spool 212, thus keeping the rectangular sheet 208 in tension.

Referring to FIG. 3C, which is a top view of the first and second cover assemblies 204, 206 of the cover assembly 202, the tensioners 210 couple to the lateral edges 250 of the rectangular sheet 208, which is shown in an unfurled or extended state.

Referring back to FIG. 3A, the rectangular sheet 208 includes, from top to bottom, a top overlay section 222, a central section 224, and an bottom underlay section 228. The first side cover assembly 204 includes an underlay coupling section 232 at its medial edge 252, and the second side cover assembly 206 includes an overlay section 234 at its medial edge at the positions where the first and second cover assemblies 204, 206 come together. Within the underlay and overlay coupling sections 232, 234 there is a fastener 236 (e.g., VELCRO®) depicted by the cross-hatched section. The first and second side cover assemblies 204, 206 may be coupled together via the fasteners 236 on the underlay and overlay coupling sections 232, 234.

To aid in the sealing of vertically adjacent cover assemblies 202 arranged above or below each other, the top overlay section 222 and the bottom underlay section 228 may also include fasteners 238 to aid in the prevention of air flowing through adjacent cover assemblies 202. As seen in FIG. 3A, the fastener 238 on the top overlay section 222 is spaced apart from the top edge 240, and the fastener 238 on the bottom underlay section 228 is immediately adjacent the bottom edge 242. In this way, when two cover assemblies 202 are positioned vertically adjacent to each other, the top overlay sections 222 of a lower cover assembly 202 will overlay the bottom underlay sections 228 of the top cover assembly 202 such that the fasteners 238 of each cover assembly 202 align with each other.

To facilitate the rectangular sheet 208 being coiled on the spool 212, the top and bottom edges 240, 242 may be folded inward (i.e., towards the central section 224, respectively) about fold lines or seams 260, 262, as seen in FIG. 3A, that are generally in-line with the top and bottom ends of the spool 212, and then the folded rectangular sheet 208 may be coiled, wound, rolled, reeled, furled, or spooled onto the spool 212. In such a furled, rolled, coiled, wound, or reeled state, the rectangular sheets 208 do not cover or block the adjacent slot in the rack 100.

As seen in FIG. 3A, the fold lines 260, 262 generally bisect or divide the overlay and underlay sections 222, 228, respectively. Stated differently, the rectangular sheet 208 may be folded at the top and bottom edges 240, 242 so a height of the rectangular sheet 208 is about the same or substantially the same (e.g., within 0.125 inch) as a height of the spool 212 of the tensioner 210. In this way, multiple cover assemblies 202 may be stacked or positioned above and below each other with the spools 212 generally coaxially aligned. The folded and furled rectangular sheet 208 (i.e., rectangular sheet 208 with the top and bottom edges 240, 242 folded inward) may be un-furled from the spool 212, and then the top and bottom edges 240, 242 may be unfolded so as to overlay or underlay with the edges 240, 242 of vertically adjacent cover assemblies 202.

Reference is made to FIG. 4, which depicts multiple cover assemblies 202t, 202b (top and bottom) used together to cover or block vertically adjacent slots in a rack. As seen in the figure, the bottom underlay sections 228 of the rectangular sheets 208 of the first and second side cover assemblies 204t, 206t at the top are positioned underneath or behind the top overlay sections 222 of the rectangular sheets 208 of the first and second cover assemblies 204b, 206b at the bottom such that the fasteners 238 overlap. Additionally, each of the underlay coupling sections 232 of the first side cover assemblies 204t, 204b are positioned underneath or behind the overlay coupling sections 234, respectively, of the second side cover assemblies 206t, 206b such that the fasteners 236 overlap. In this way, the rectangular sheets 208 of the first side cover assemblies 204t, 204b couple with the second side cover assemblies 206t, 206b at about a midpoint between the vertical mounting posts 110 of the rack 100.

The first and second cover assemblies 204t, 204b, 206t, 206b may couple together via interaction of the fasteners 236, which may be any type of hook and loop fastener such as, for example, VELCRO®, magnets, or other mechanical device for fastening two objects or surfaces together. It is noted that the fasteners 236 of the underlay and overlay coupling sections 232, 234 are positioned centrally so as to not extend to the top and bottom edges 240, 242 of the rectangular sheet 208 for ease of coupling and decoupling the fasteners 236. The fasteners 236 may, however, extend to the top and bottom edges 240, 242 of the rectangular sheet 208. It is also noted that while the fasteners 238 are shown on only a portion of the overlay and underlay sections 222, 228, the fasteners 238 may be positioned on the entire overlay and underlay sections 222, 228. Additionally or alternatively, the fasteners 238 may be positioned on other portions of the overlay and underlay sections 222, 228 than are depicted in the figures. Positioning the fasteners 238 on only one side of the overlay and underlay sections 222, 228, as shown in the figures, may provide less bulk when folding the top and bottom edges 240, 242, and coiling the rectangular sheet 208 on the spool 212.

Each cover assembly 202t, 202b may cover 1 RU of space in a rack 100 while also extending up and down to portions of adjacent slots or openings in the rack 100 via the extension of the top and bottom edges 240, 242. That is, adjacent cover assemblies 202t, 202b, as seen in FIG. 4, do not merely meet edge-to-edge, but, instead, overlap portions of each other to provide a seal between the adjacent cover assemblies 202. While the cover assemblies 202 are described as being 1 RU in height, the cover assemblies 202 may be designed to be 2 RU, 3 RU, 4 RU, 5 RU, 6 RU, 7 RU, 8 RU, 9 RU, or 10 RU in height, among others.

In certain instances, as seen on the left side of FIG. 4, the cover assemblies 202 may be coupled to the vertical mounting posts of a rack 100 via a bracket 244 that couples to the vertical mounting posts 110 of the rack 100. In this way, individual cover assemblies 202 may be attached and/or detached to the rack 100 on an as-needed basis via the bracket 244. That is, for example, when an operator removes a 2 RU piece of equipment 102 (not shown in FIG. 4) from the rack 100, the operator may install two vertically adjacent cover assemblies 202 in the vacant space where the 2 RU piece of equipment 102 was previously mounted.

In certain instances, as seen on the right side of FIG. 4, the cover assemblies 202 may be coupled to an external structure such as, for example, a vertical shaft 246 that is generally parallel with the vertical mounting posts 110 of the rack 100. The vertical shaft 246 may be coupled to the rack 100 at, for example, the vertical mounting posts 110. In such an instance, multiple cover assemblies 202 may be stacked on the vertical shaft 246. In FIG. 4, four second side cover assemblies 206 are shown for reference, but any number could be shown including forty-four to match a rack 100 of 44 RU.

In certain instances, one or more cover assembly 202 including the first and second side cover assemblies 204, 206 may be combined into a kit. In certain instances, the kit may include one or more brackets 244 and/or one or more vertical shafts 246 for coupling the tensioner and rectangular sheet 208 to the rack 100.

In certain instances, and as discussed in reference to FIG. 2A, FIG. 2A, a rack covering system 200 may include multiple cover assemblies 202 that are 1 RU in height. The multiple cover assemblies may be referred to as a first cover assembly for covering a first slot in a rack and a second cover assembly for covering a second slot in the rack. The second slot may be positioned below the first slot. The first cover assembly may include a first left side cover and a first right side cover. Similarly, the second cover assembly may include a second left side cover and a second right side cover. The first and second left side covers may couple to a left portion or side of the rack (as seen in FIG. 4), while the first and second right side covers may couple to a right portion or side of the rack (also seen in FIG. 4). Each of the covers may include a rectangular sheet 208 that may extend and retract from the right and left portions of the rack via an associated tensioner having a spool. When the rectangular sheets 208 are in an extended state, the right and left covers may couple to each other via fasteners at their medial edges. In the extended state, the slots are covered. In an opposite or furled state, the rectangular sheets 208 are retracted and furled on the spool. In the furled state, the slots are open or not covered.

In this arrangement with a first and a second cover assembly in a vertically arranged manner, a top edge of the second cover assembly may overlay or underlay a bottom edge of the first cover assembly.

As discussed herein, the tensioners on the left portion of the rack may couple with a vertically oriented shaft that is affixed relative to a left side vertical mounting post of the rack, and the tensioners on the right portion of the rack may couple with a vertically oriented shaft that is affixed relative to a right side vertical mounting post of the rack. The tensioners may be stacked on each other on the shafts. And since the height of the tensioners are the same as the slot height (e.g., 1 RU), vertically stacking the tensioners should align the tensioner with each of the slots in the rack.

Figure 5:
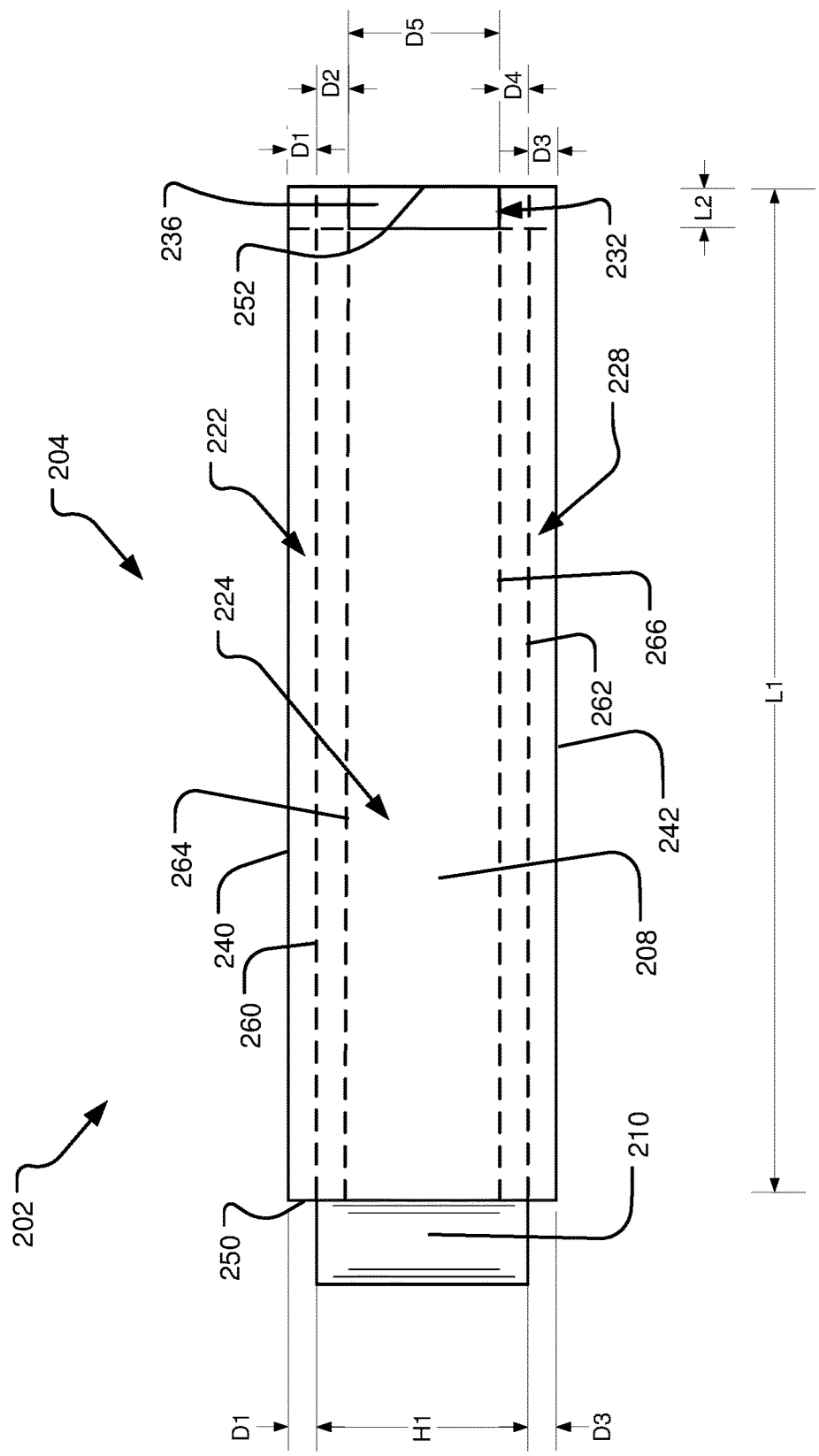
FIG. 5 is a front view of a first side cover assembly with exemplary dimensions.

In certain instances, the first and second cover assemblies 204, 206 may be sized as shown in FIG. 5, which is a front view of a first side cover assembly 204 of the cover assembly 202. While the second side cover assembly 206 is not shown in FIG. 5, the dimensions may be the same or similar. As seen in the figure, a height H1 of the tensioner 210 may be about 1.75 inches. A distance D1 between a top edge of the tensioner 210 to the top edge 240 of the rectangular sheet 208 may be about 0.125 inch. The distance D1 may also be expressed as being between the top edge 240 and the fold line 260 on the overlay section 222. When the top edge 240 is folded along the fold line 260, the top edge 240 extends a distance D2 from the fold line 260 to an inner end 264 of the overlay section 222. Distance D2 may be the same as D1 and may be about 0.125 inch. A distance D3 between a bottom edge of the tensioner 210 to the bottom edge 242 of the rectangular sheet 208 may be about 0.125 inch. The distance D3 may also be expressed as being between the bottom edge 242 and the fold line 262 on the underlay section 282. When the bottom edge 242 is folded along the fold line 262, the bottom edge 242 extends a distance D4 from the fold line 262 to an inner end 266 of the underlay section 228. Distance D4 may be the same as D3 and may be about 0.125 inch. A distance D5 between the inner ends 264, 266 of the overlay and underlay sections 222, 228 may be about 1.5 inches. In sum, a height of the rectangular sheet 208 may be expressed as the sum of D1, D2, D3, D4, and D5, which may be about 2 inches. In this way, the height of the rectangular sheet 208 may be greater than the height H1 of the tensioner 210. Stated differently, the height H1 of the tensioner 210 may be less than the height of the rectangular sheet 208.

A length L1 of the rectangular sheet 208 between the lateral edge 250 and the medial edge 252 may be about 9.625 inches. A length L2 of the coupling section 232 may be about 0.125 inch. The difference between L1 and L2 may be about 9.5 inches, which represents a non-overlapping portion of the length L1 of the rectangular sheet 208.

The rectangular sheet 208 may be made of a non-flammable material. The material may be a metallic mesh material or any suitable material.

The aforementioned dimensions are exemplary and are not intended to limit the scope of the disclosure. Other dimensions may be used without departing from the teachings herein.

Although various representative embodiments of this invention have been described above with a certain degree of particularity, those skilled in the art could make numerous alterations to the disclosed embodiments without departing from the spirit or scope of the inventive subject matter set forth in the specification. All directional references (e.g., top, bottom, medial, lateral) are only used for identification purposes to aid the reader's understanding of the embodiments of the present invention, and do not create limitations, particularly as to the position, orientation, or use of the invention unless specifically set forth in the claims. Joinder references (e.g., attached, connected, coupled, and the like) are to be construed broadly and may include intermediate members between a connection of elements and relative movement between elements. As such, joinder references do not necessarily infer that two elements are directly connected and in fixed relation to each other.

What is claimed is:

1. A rack cover assembly comprising:
a first side cover comprising a first tensioner and a first flexible rectangular sheet comprising a first lateral edge, a first medial edge opposite the first lateral edge, a first top edge, and a first bottom edge opposite the first top edge and adjacent the first lateral edge and the first medial edge, the first medial edge comprising a first fastener, the first tensioner coupled to the first flexible rectangular sheet at or near the first lateral edge, the first tensioner comprising a first tensioner height that is less than a first sheet height between the first top edge and the first bottom edge, the first tensioner exerting a first retraction force that tensions the first flexible rectangular sheet when the first flexible rectangular sheet is extended to cover a first portion of a slot in a rack; and
a second side cover comprising a second tensioner and a second flexible rectangular sheet comprising a second lateral edge, a second medial edge opposite the second lateral edge, a second top edge, and a second bottom edge opposite the second top edge and adjacent the second lateral edge and the second medial edge, the second medial edge comprising a second fastener configured to couple with the first fastener, the second tensioner coupled to the second flexible rectangular sheet at or near the second lateral edge, the second tensioner comprising a second tensioner height that is less than a second sheet height between the second top edge and the second bottom edge, the second tensioner exerting a second retraction force that tensions the second flexible rectangular sheet when the second flexible rectangular sheet is extended to cover a second portion of the slot in the rack, wherein the first side cover and the second side cover are configured to be used in conjunction with one another to cover the slot in the rack.

2. The rack cover assembly as recited in claim 1, wherein the first tensioner height is equal to the second tensioner height, and the first sheet height is equal to the second sheet height.

3. The rack cover assembly as recited in claim 2, wherein the first sheet height and the second sheet height are at least 1.75 inches.

4. The rack cover assembly as recited in claim 2, wherein the first sheet height and the second sheet height are about 2.0 inches.

5. The rack cover assembly as recited in claim 1, wherein the first fastener and the second fastener comprise a complementary hook and loop closure system.

6. The rack cover assembly as recited in claim 1, further comprising at least one of a tensioner bracket or a shaft for coupling the first and second side covers to the rack.

7. A kit comprising at least one of the rack cover assembly as recited in claim 1, further comprising packaging materials to package the at least one of the rack cover assembly.

8. The kit as recited in claim 7, further comprising at least one tensioner bracket for coupling the rack cover assembly to the rack.

9. The kit as recited in claim 7, further comprising at least one shaft for vertically orienting the at least one of the rack cover assembly relative to the rack.

10. The rack cover assembly as recited in claim 1, the first tensioner further comprising a first spool, the first flexible rectangular sheet configured to furl on the first spool, the second tensioner further comprising a second spool, and the second flexible rectangular sheet configured to furl on the second spool.

11. A system for blocking slots in a rack comprising:
an upper cover assembly for covering an upper slot in the rack and comprising a first upper side cover and a second upper side cover, the first upper side cover coupling to a first portion of the upper slot in the rack, the second upper side cover coupling to a second portion of the upper slot in the rack, the first upper side cover comprising a first upper side flexible rectangular sheet and a first upper tensioner coupled to the first upper side flexible rectangular sheet, the first upper side flexible rectangular sheet configured to extend and retract from the first portion of the rack, the first upper tensioner exerting a first retraction force that tensions the first upper side flexible rectangular sheet when the first upper side flexible rectangular sheet is extended to cover the first portion of the upper slot in the rack, the second upper side cover comprising a second upper side flexible rectangular sheet and a second upper tensioner coupled to the second upper side flexible rectangular sheet, the second upper side flexible rectangular sheet configured to extend and retract from the second portion of the rack, the second upper tensioner exerting a second retraction force that tensions the second upper side flexible rectangular sheet when the second upper side flexible rectangular sheet is extended to cover the second portion of the upper slot in the rack, the first upper side flexible rectangular sheet and the second upper side flexible rectangular sheet configured to couple to each other when in a first extended state so as to cover the upper slot, and
a lower cover assembly for covering a lower slot in the rack, the lower slot being immediately below the upper slot, the lower cover assembly comprising a first lower side cover and a second lower side cover, the first lower side cover coupling to the first portion of the lower slot in the rack, the second lower side cover coupling to the second portion of the lower slot in the rack, the first lower side cover comprising a first lower side flexible rectangular sheet and a first lower tensioner coupled to the first lower side flexible rectangular sheet, the first lower side flexible rectangular sheet configured to extend and retract from the first portion of the rack, the first lower tensioner exerting a third retraction force that tensions the first lower side flexible rectangular sheet when the first lower side flexible rectangular sheet is extended to cover the first portion of the lower slot in the rack, the second lower side cover comprising a second lower side flexible rectangular sheet and a second lower tensioner coupled to the second lower side flexible rectangular sheet, the second lower side flexible rectangular sheet configured to extend and retract from the second portion of the rack, the second lower tensioner exerting a fourth retraction force that tensions the second lower side flexible rectangular sheet when the second lower side flexible rectangular sheet is extended to cover the second portion of the lower slot in the rack, the first lower side flexible rectangular sheet and the second lower side flexible rectangular sheet configured to couple to each other when in a second extended state so as to cover the lower slot.

12. The system as recited in claim 11, wherein a top edge of the lower cover assembly overlays or underlays a bottom edge of the upper cover assembly.

13. The system as recited in claim 11, further comprising a first side shaft affixed relative to the first portion of the rack and a second side shaft affixed relative to the second portion of the rack, the first upper tensioner and the first lower tensioner being vertically arranged or stacked on the first side shaft, the second upper tensioner and the second lower tensioner being vertically arranged or stacked on the second side shaft.

14. The system as recited in claim 11, the first upper tensioner further comprising a first spool, the first upper side flexible rectangular sheet configured to furl on the first spool, the second upper tensioner further comprising a second spool, the second upper side flexible rectangular sheet configured to furl on the second spool, the first lower tensioner further comprising a third spool, the first lower side flexible rectangular sheet configured to furl on the third spool, the second lower tensioner further comprising a fourth spool, and the second lower side flexible rectangular sheet configured to furl on the fourth spool.

15. A rack cover assembly comprising:
a first side cover comprising a first tensioner and a first flexible rectangular sheet comprising a first lateral edge, a first medial edge opposite the first lateral edge, a first top edge, and a first bottom edge opposite the first top edge and adjacent the first lateral edge and the first medial edge, the first medial edge comprising a first fastener, the first tensioner coupled to the first flexible rectangular sheet at or near the first lateral edge, the first tensioner comprising a first tensioner height that is less than a first sheet height between the first top edge and the first bottom edge, the first tensioner further comprising a first spool, the first flexible rectangular sheet configured to furl on the first spool; and
a second side cover comprising a second tensioner and a second flexible rectangular sheet comprising a second lateral edge, a second medial edge opposite the second lateral edge, a second top edge, and a second bottom edge opposite the second top edge and adjacent the second lateral edge and the second medial edge, the second medial edge comprising a second fastener configured to couple with the first fastener, the second tensioner coupled to the second flexible rectangular sheet at or near the second lateral edge, the second tensioner comprising a second tensioner height that is less than a second sheet height between the second top edge and the second bottom edge, the second tensioner further comprising a second spool, the second flexible rectangular sheet configured to furl on the second spool, wherein the first side cover and the second side cover are configured to be used in conjunction with one another to cover a slot in a rack.

16. The rack cover assembly as recited in claim 15, wherein the first tensioner height is equal to the second tensioner height, and the first sheet height is equal to the second sheet height.

17. The rack cover assembly as recited in claim 15, wherein the first fastener and the second fastener comprise a complementary hook and loop closure system.

18. The rack cover assembly as recited in claim 15, further comprising at least one of a tensioner bracket or a shaft for coupling the first and second side covers to the rack.

19. A kit comprising at least one of the rack cover assembly as recited in claim 15, further comprising packaging materials to package the at least one of the rack cover assembly.

20. The rack cover assembly as recited in claim 15, the first tensioner providing a first rotational force that tensions the first flexible rectangular sheet when it is extended to cover a first portion of the slot in the rack, and the second tensioner providing a second rotational force that tensions the second flexible rectangular sheet when it is extended to cover a second portion of the slot in the rack.

* * * * *